United States Patent [19]

Uchida et al.

[11] Patent Number: 5,132,557
[45] Date of Patent: Jul. 21, 1992

[54] SAMPLING HEAD

[75] Inventors: Satoru Uchida; Tsuyoshi Takihara; Sadaharu Oka; Akira Miura; Shinji Kobayashi; Hiromi Kamata, all of Tokyo, Japan

[73] Assignee: Yokogawa Electric Corporation, Tokyo, Japan

[21] Appl. No.: 596,858

[22] Filed: Oct. 12, 1990

[30] Foreign Application Priority Data

Oct. 31, 1989 [JP] Japan .................. 1-284511

[51] Int. Cl.⁵ .................. H03K 5/159; H03K 4/787; H03K 17/74
[52] U.S. Cl. .................. 307/352; 307/322; 307/257
[58] Field of Search .............. 307/502, 352, 353, 563, 307/566, 323, 321, 322, 257

[56] References Cited

U.S. PATENT DOCUMENTS

| | | | |
|---|---|---|---|
| 3,676,656 | 7/1972 | Schmidt | 364/744 |
| 3,771,056 | 11/1973 | Zimmerman | 324/130 |
| 4,868,418 | 9/1989 | Imamura et al. | 307/322 |

Primary Examiner—Eugene R. LaRoche
Assistant Examiner—Evelyn A. Lester

[57] ABSTRACT

A sampling head having an input to which a sampling signal is applied, a diode bridge to which the sampling signal is applied, and a strobe pulse generator for controlling the gage time of the diode bridge; wherein the strobe pulse generator comprises a resonance tunnel barrier diode, whereby high speed measurement and miniaturization are attained.

7 Claims, 12 Drawing Sheets

| Composition [Nd/cm³] | Thickness (Å) |
|---|---|
| (12) In.Ga.Al.As ($1\times10^{16}$) | 3000 |
| (11) In.Ga.Al.As ($1\times10^{19}$) | 500 |
| (10) In Ga As ($1\times10^{14}$) | 4000 |
| (9) In Ga As ($1-2\times10^{17}$) | 1500 |
| (8) u-In Ga As (spacer) | ~15 |
| (7) u-Al As (barrier) | ~30 |
| (6) u-In Ga As (well) | ~41 |
| (5) u-Al As (barrier) | ~30 |
| (4) u-In Ga As (spacer) | ~15 |
| (3) In Ga As ($1\times10^{18}$) | 1000 |
| (2) In Ga As ($1\times10^{19}$) | 4000 |
| (1) u-In Al As | 5000 |
| (S) InP (substrate) | 400 (μm) |

RTD I-V Characteristic curve

Portions corresponding to dotted line parts in Fig.12(a)

SAMPLING HEAD

BACKGROUND OF THE INVENTION

1. Field of Invention

This invention relates to a sampling head provided in a high frequency device, such as a sampling oscilloscope; and more particularly, to such a sampling head which is capable of high speed measurement and which can be readily miniaturized.

2. Description of the Prior Art

A sampling head, such as disclosed in U.S. Pat. No. 3,629,731, is used in a sampler which functions to gather a measured high frequency signal at a predetermined cycle and to re-synthesize the gathered data at a low frequency. The sampling head, used for the sampler, is an important element of a high frequency device, such as a network analyzer or a waveform analyzer.

In the sampling head, a measurement frequency band is determined by a gate time of a diode bridge included therein. In order to gate the diode bridge, an impulse, also called a strobe pulse, is used. In the conventional apparatus, a step recovery diode (SRD) is used for a high frequency strobe pulse generator. Also, GaAs Schottky barrier diodes (SBD) are used for the diode bridge. A strobe command pulse, used for gating the diode bridge, is produced by an outside device, and is applied to the diode bridge through a bonding material.

The above conventional device has many problems. For example, the upper limit of the sampling frequency is determined by the pulse width of the strobe pulse. However, when the SRD is used as a strobe pulse generator, the pulse width can not be made to be less than 30 ps. Thus, the frequency band is limited. Also, since the SRD involves a quantity of jitters, time resolution is not improved. Moreover, a large power (about 100 Vpp and 1 A) is necessary to drive the SRD, and the output pulse includes large noise components.

In case a GaAs Schottky barrier diode is used as the diode bridge, the characteristic (ON voltage $V_F$) is not controlled. Thus, desired performance is not obtained. Further, the strobe pulse used for gating the diode bridge is applied from the outside device through a bonding material, and thus, the frequency band is limited by the loss at the bonding or connecting part.

SUMMARY OF THE INVENTION

Accordingly, an object of the invention is to overcome the aforementioned and other deficiencies, disadvantages and problems of the prior art.

Another object is to provide a sampling head having a wide frequency band, a wide dynamic range, low noise characteristics, and low jitter characteristics.

Another object is to provide a sampling head which can be readily miniaturized.

These objects are attained by a sampling head in which a resonance tunnel barrier diode (hereinafter called RTD) is used as a strobe pulse generator.

BRIEF DESCRIPTION OF THE DRAWINGS

FIGS. 9(a)-9(f) are diagrams depicting the characteristics of a Schottky diode, wherein FIGS. 9(a) to 9(c) depict the forward direction characteristics thereof, and FIGS. 9(d) to 9(f) depict the reverse direction characteristics thereof.

DETAILED DESCRIPTION OF THE PREFERRED EMBODIMENTS

Figure 1:
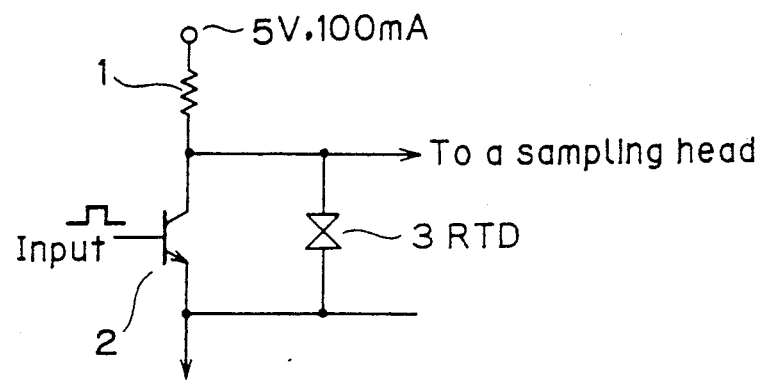
FIG. 1 is a diagram depicting one example of a strobe pulse generating means of the invention.

In FIG. 1 a strobe pulse generating device is shown comprising resistor 1, one end of which is connected to a collector of a transistor 2, whose emitter is connected to common, and RTD 3 is connected between the collector and emitter of transistor 2.

In a conventional apparatus, an SRD (step recovery diode) is connected between the collector and the emitter of transistor 2. This invention is different from the conventional apparatus in that an RTD is used in place of the SRD. Moreover, this invention is different in that a pulse voltage signal having 5 V pp and 100 mA is used as the drive signal for the RTD. In the conventional apparatus which uses an SRD, this drive signal is about 100 V pp and 1 A.

Figure 2:
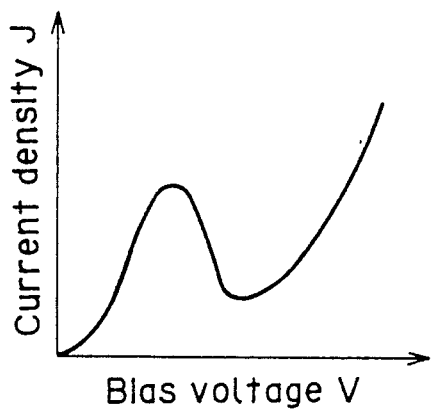
FIG. 2 is a graph depicting a functional conceptualization of an RTD.
Figure 3A:
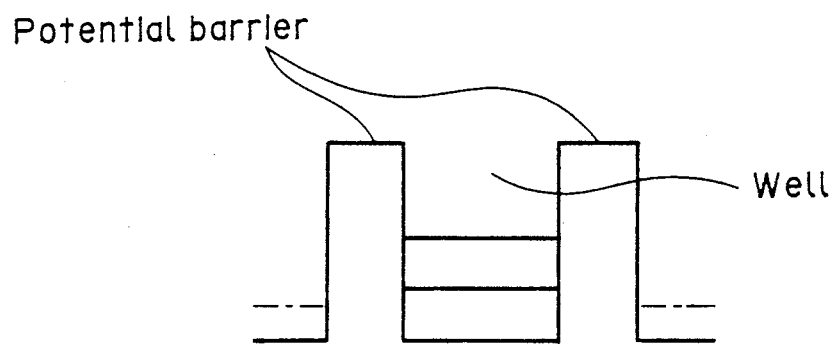
FIGS. 3(a), 3(b) and 3(c) are diagrams depicting the energy band of the RTD.
Figure 3B:
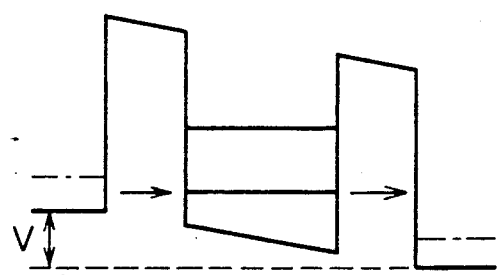
Figure 3C:
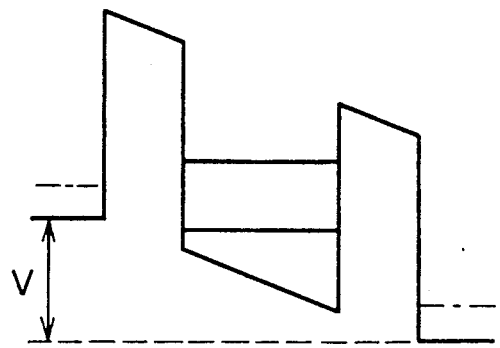

The function of the RTD will now be explained in connection with FIG. 2 and FIGS. 3(a)-3(c). In FIG. 2, the relation between the bias voltage and the current density of the RTD is shown in graph form.

The structure of the RTD is constituted by two potential barrier layers and a well (i.e. a quantum well) which is sandwiched between these potential barrier layers. The layer structure is a one dimensional well type potential structure, and in the well layer, quantum mechanical discrete levels are generated.

When voltage is applied to both ends of the RTD, and when the electronic energy on the cathode side coincides with one of the levels of the well, a current having the negative resistance characteristics shown in FIG. 2, flows.

The switching speed of the RTD is extremely high. Thus, the RTD can oscillate at a high frequency, for example, at more than 200 G Hz. Moreover, the jitter which occurs in the RTD is less than that of the SRD. Thus, the time resolution is greatly improved. Furthermore, a large and high speed power pulse transformer is not necessary for driving the RTD.

An Esaki diode is well known as a negative resistance device. However, structurally, it is impossible to reduce the volume of capacitance because of its $p^{++}n^{++}$ junction. As a result, the charging time constant of the Esaki diode becomes large. In contrast, in the case of the RTD, the volume of capacitance can be reduced to about 1/100 of that of the Esaki diode. Furthermore, in the Esaki diode, the amplitude is limited by the component material. Thus, it is impossible to change the amplitude even when necessary.

Figure 4:
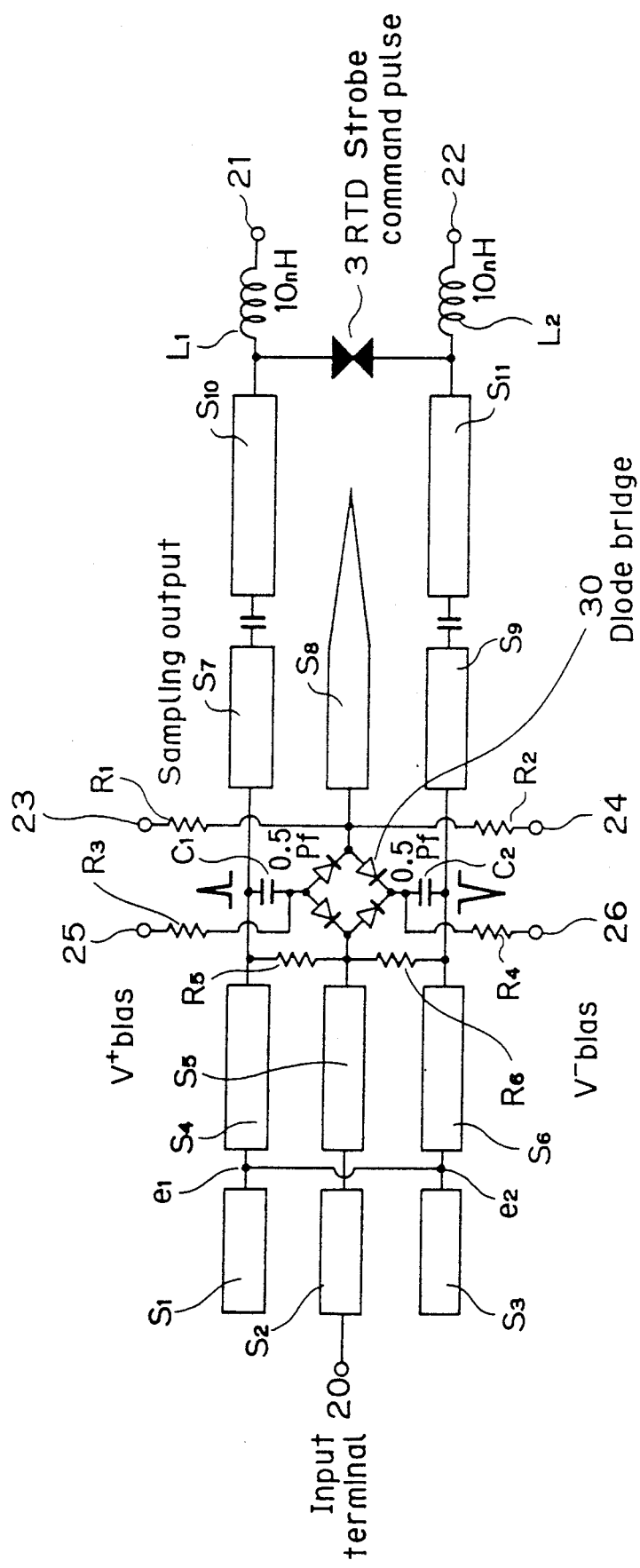
FIG. 4 is a circuit diagram depicting a sampling head of the invention.

FIG. 4 depicts the circuit configuration of a sampling head, wherein diode bridge 30, RTD 3, resistors $R_1$-$R_6$ and capacitors $C_1$ $C_2$ are formed on an InP substrate in a monolithic manner. Portions $S_1$ to $S_{11}$ are formed by use of conductive thin films, such as gold. Of these films, $S_1$ and $S_3$ are connected in common. The width of conductive thin films $S_2$, $S_5$ an $S_8$ are formed to be about 1/10 of that of the other thin films.

A high frequency signal is applied to an input terminal 20, and then is applied to diode bridge 30 through thin films $S_2$ and $S_5$.

On the other hand, a strobe command pulse is applied to terminals 21 and 22. This pulse is applied to RTD 3 connected in parallel to coils $L_1$ and $L_2$, each being about 10 nH, which comprise a strobe pulse generator. A strobe pulse generated from RTD 3 passes thin films $S_{10}$ and $S_7$ and also thin films $S_{11}$ and $S_9$, and is applied to diode bridge 30 through small capacitors $C_1$ and $C_2$, each being about 0.5 pF. The strobe pulse causes diode bridge 30 to be conductive.

The strobe pulse advances further and reflects reversely at short circuit ends $e_1$ and $e_2$ of thin films $S_4$ and $S_6$. As a result, diode bridge 30 is made to be non-conductive by the reflected strobe pulse. The gate time period when diode bridge 30 is made to be conductive, corresponds to the time when the strobe pulse shuttles between the distance from diode bridge 30 to the short circuit end of thin film $S_4$ or $S_6$.

A sampling signal obtained during the above gate period is held by thin films $S_8$ which comprises a capacitor, and is outputted from output terminals 23 and 24 through resistors $R_1$ and $R_2$. Coils $L_1$ and $L_2$ functions to stabilize the current.

From terminals 25 and 26, a bias voltage is applied to diode bridge 30 through resistors $R_3$ and $R_4$, by which diode bridge 30 is held in a non-conductive state unless the strobe pulse is applied.

According to the embodiment, a transmission line of the input high frequency signal, constituted by thin films $S_2$ and $S_5$, is surrounded by thin films $S_1$, $S_4$, $S_3$ and $S_6$, and further, thin film $S_8$ is surrounded by thin films $S_7$ and $S_9$. These portions comprise a coplanar wave guide (called $C^{PW}$). Furthermore, thin films $S_{10}$, $S_7$ and $S_4$, and thin films $S_{11}$, $S_9$ and $S_6$ can be regarded as coplanar stripping lines (called CPS).

As discussed, the width of thin films $S_2$, $S_5$ and $S_8$ is each made to be about 1/10 of the width of the width of other thin films. Thus, mismatching of the coplanar stripping line at thin film portions $S_8$ can be neglected for practical purposes. As a result, impedance mismatching does not occur between the coplanar wave guide and the coplanar stripping lines. Thus, high frequency signals can pass these parts without loss.

In this embodiment, resistors $R_5$ and $R_6$, which are each of 100 ohms, are provided in parallel, thereby to form a terminal resistor of 50 ohms. Both the coplanar wave guide and the coplanar stripping lines are matched with the 50 ohm impedance system.

In the above mentioned sampling head, bias supply wirings to diode bridge 30 and sample signal output wirings intersect the coplanar wave guide and the coplanar stripping lines where impedance matching has been treated. In this case, mismatching occurs as to the line capacitances. Thus, it is necessary to reduce the amount of this capacitance. For this purpose, an air bridge is conventionally used as the cross wiring. However, this type of cross wiring has such problems as limitations in making minute patterns, and lack of strength.

In this invention, polyimide resin is used as an insulating film. Advantageously, polyimide resin has small dielectric constant in comparison with $SiO_2$ or $Si_3N_4$. The line capacitance can be disregarded if the thickness of the polyimide resin is made to be about 5 microns. However, it is difficult to form such polyimide resin layer at one time. Accordingly, in this invention, the polyimide resin layer is formed as a two layer structure.

Figure 5:
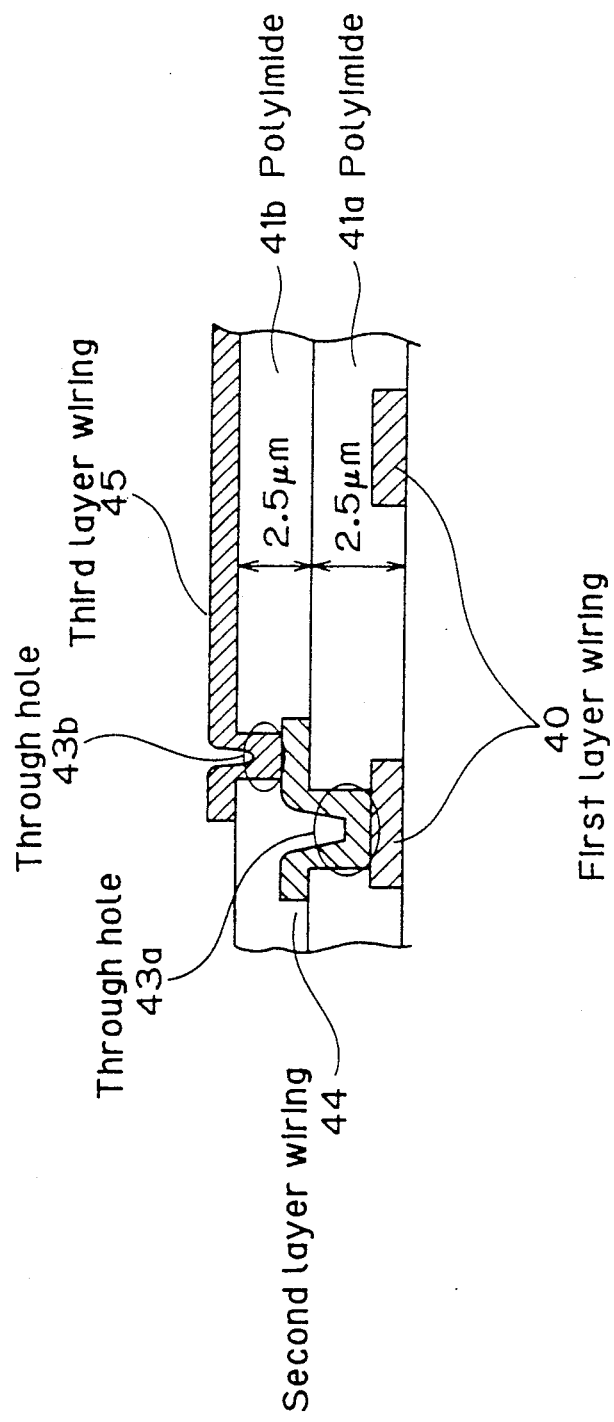
FIG. 5 is a diagram depicting one example of cross wiring.

FIG. 5 shows the cross section of an exemplary cross wiring, wherein a polyimide resin layer 41a having a thickness of about 2.5 microns is deposited on a first wiring layer 40 (which may be the lead for the copolanar wave guide or the cross wiring), and is baked, in $N_2$ atmosphere, at about 300 degree C. Then, a through hole 43a is formed in layer 41a at places where the wirings cross, and a second layer wiring 44 is formed. On top of this, a polyimide resin layer 41b having a thickness of about 2.5 microns is deposited and then baked in a similar manner.

Next, a through hole 43b which reaches the top of second L wiring 44 is formed in layer 41b, and a third layer wiring 45 crossing the first layer wiring 40, is formed.

By this wiring arrangement, the line capacitance between first layer wiring 40 and the third layer wiring 45 can be made equivalent as in case of the air bridge. As a result, it is possible to miniaturize the wirings.

Figures 6A, 6B:
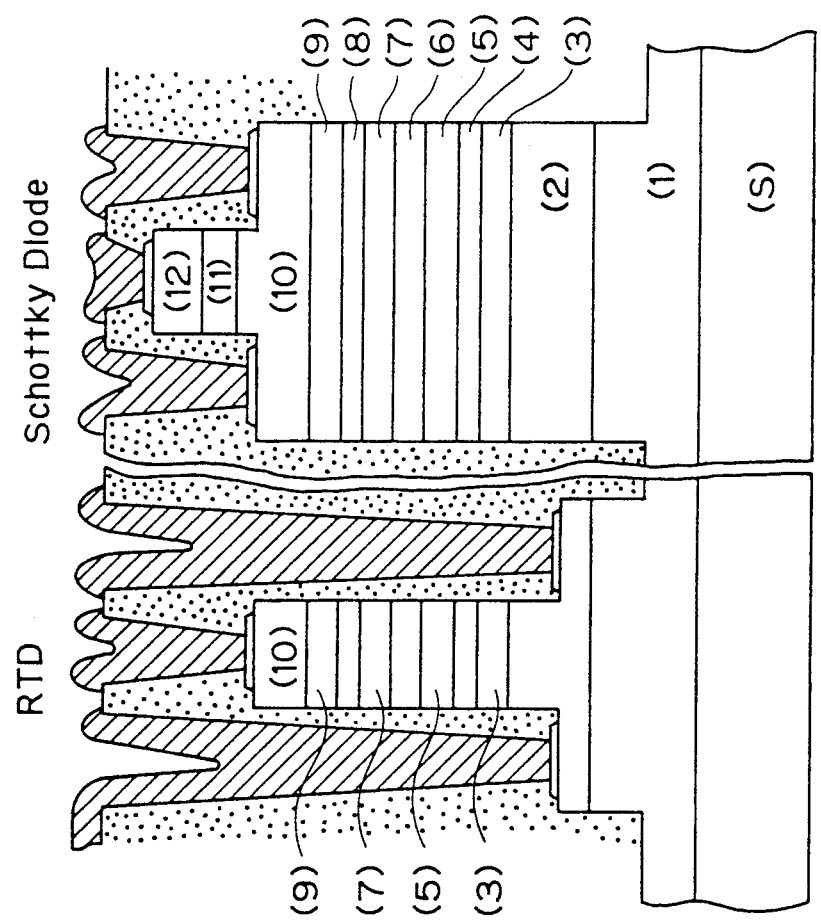
FIG. 6(a) is a diagram depicting a cross section of an RTD and a Schottky barrier diode (hereinafter called SBD).
FIG. 6(b) is a table depicting the layer thicknesses of the RTD and SBD.

FIG. 6(a) shows the cross section of an RTD and Schottky diode as constituted by a four element mixed crystal of InGaAlAs; and FIG. 6(b) shows the layer thicknesses thereof. In these figures, layers 5, 6, and 7 comprise the resonance layers of the RTD, with layer 6 being of InGaAs and having a thickness of 41 Angstroms and being sandwiched by layers 5 and 7 which are of AlAs and which each has a thickness of 30 Angstroms, so that a distortion super lattice is formed.

By means of the distortion super lattice, band discontinuity of the conductor becomes large. Thus, leakage current at room temperature can be reduced, and peak-to-valley ratio can be enlarged.

In the conventional apparatus, the resonance layer is formed in such a manner that a GaAs layer having a thickness of about 50 Angstroms is sandwiched by AlGaAs layers having thicknesses of about 50 Angstroms. Furthermore, in such apparatus, a voltage signal having an amplitude of more than 0.8 volts, which is twice as much as the ON voltage of the Schottky diode, is necessary to drive the diode bridge.

On the other hand, advantageously, in this invention, in order to obtain a large amplitude output, the impurity concentration of n type InGaAs layer 9 formed on the positive pole side of the RTD is reduced by about $(1-2) \times 10^{17} cm^{-3}$, and is made asymmetrical with respect to the impurity concentration of n type InGaAs layer 3 which functions as a negative pole.

The increase of this output amplitude results because the depletion layer extending to the InGaAs layer formed on the positive pole side of the resonance depletion layer, expands by reducing the impurity concentration. Incidently, when the word amplitude is stated herein, it generally refers to output amplitude, unless the meaning is otherwise from the context of its usage. By reducing the impurity concentration, parasitic capacitance can be also reduced. Thus, both increase in speed and increase of amplitude are accomplished in the invention at the same time.

Figure 7A:
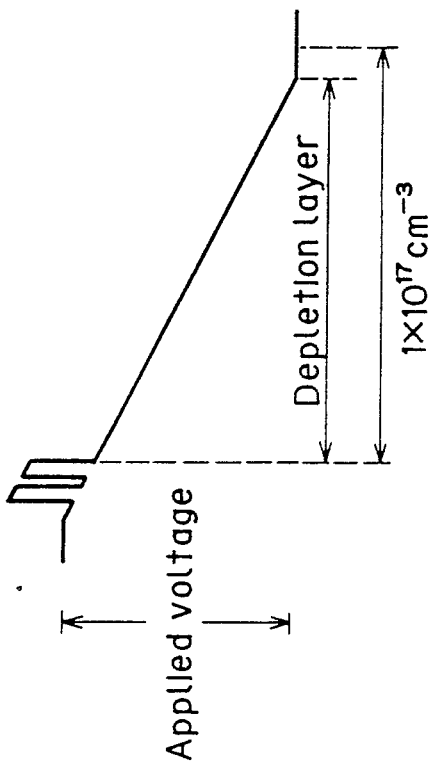
FIGS. 7(a) and 7(b) are diagrams depicting the conceptualization of an electric field applied to the barrier of the RTD.
Figure 7B:
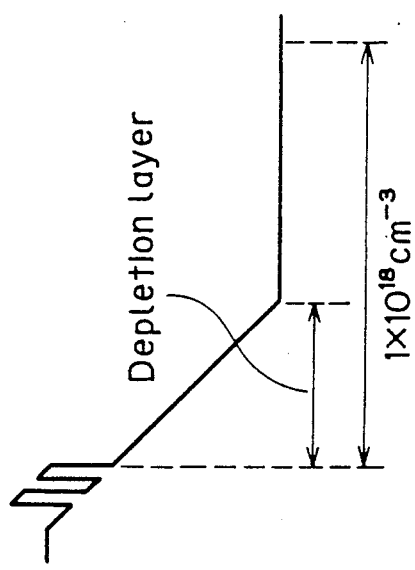

FIGS. 7(a) and 7(b) are diagrams depicting an electric field applied to the depletion layer of the RTD, wherein FIG. 7(a) shows a symmetrical type, and FIG. 7(b) shows an asymmetrical type. As can be seen from these figures, even if the same voltage is applied, the voltage which exerts influence upon the barrier is different between the two cases. When the depletion layer is thin, the above voltage becomes large. In contrast, when the depletion layer is thick, the above voltage becomes small.

Figure 8:
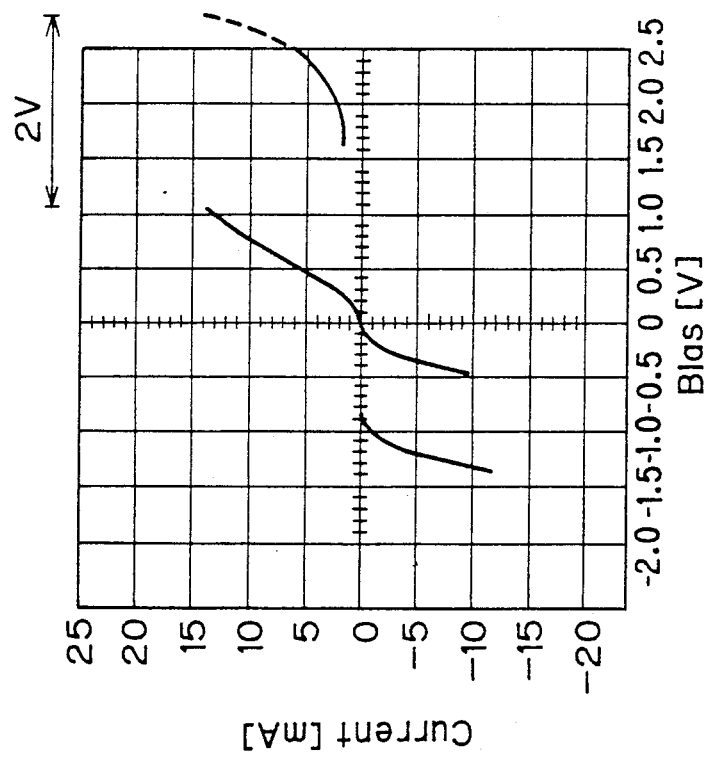
FIG. 8 is a diagram depicting the I-V characteristics of the RTD.
Figure 9A:
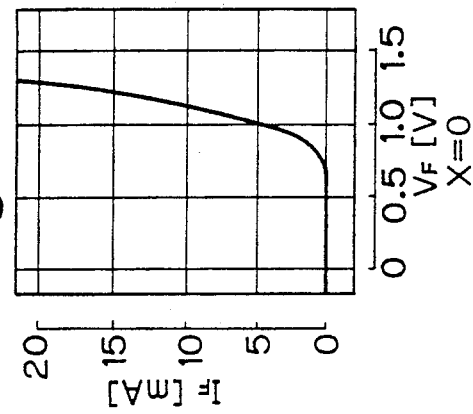
Figure 9B:
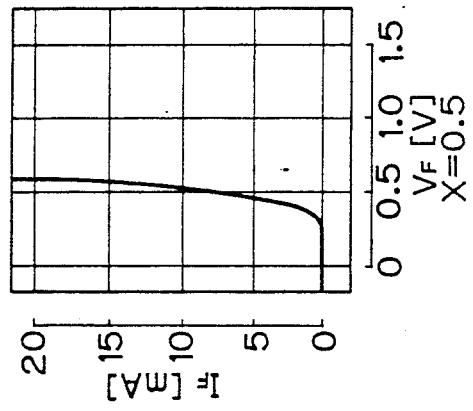
Figure 9C:
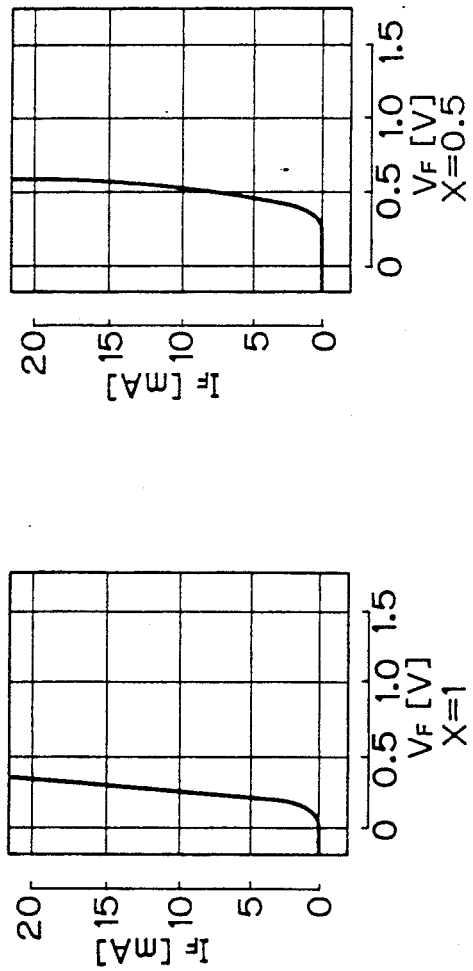
Figure 9D:
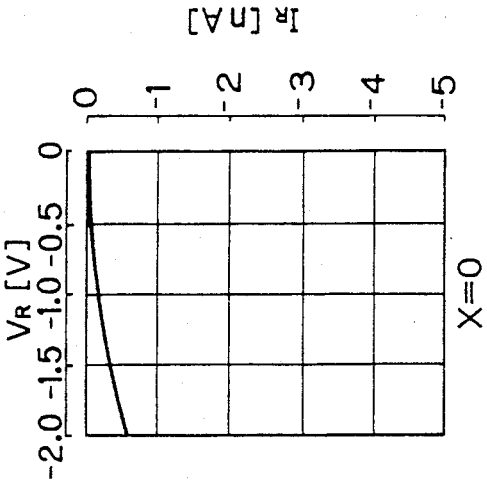
Figure 9E:
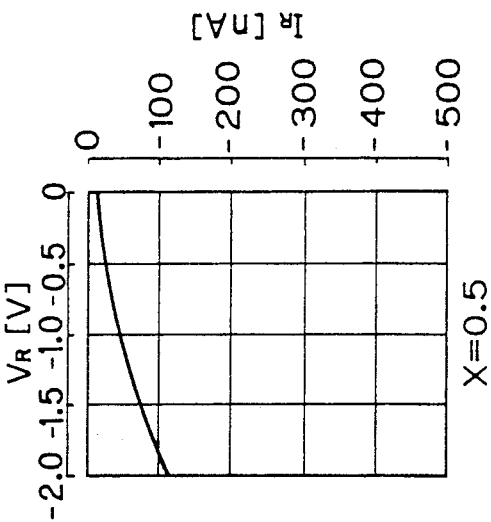
Figure 9F:
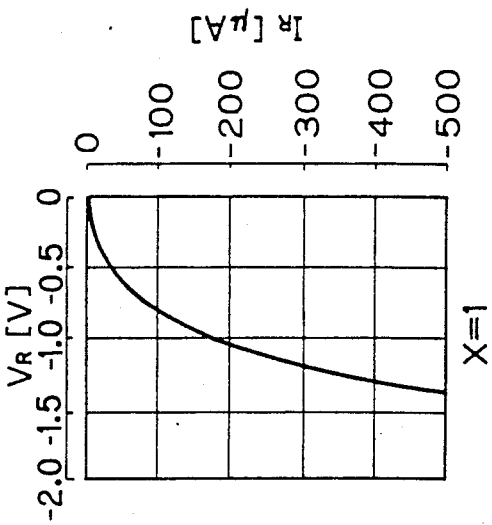

FIG. 8 is a diagram depicting the I-V characteristic of the RTD. In this RTD, the impurity concentration on the positive pole side is made to be $1 \times 10^{17} cm^{-1}$, and a positive voltage is applied to the positive pole side. As a result, an amplitude of about 2 volts can be obtained as shown.

In FIGS. 6(a) and 6(b), layers 11 and 12 which comprise the Schottky barrier diode together with layer 12, are made of a four element mixed crystal of InGaAlAs. If the component of the InGaAlAs is changed in such a manner as $(InGaAs)_x(InAlAs)_{1-x}$, wherein x is a value changing from 0 to 1, and the ON voltage $V_F$ of the diode is changeable from 0.15 V to 0.8 V.

FIGS. 9(a) to 9(f) depict the characteristics of the Schottky diode, wherein the mixture ratio x is changed in such a manner as x=1, x=0.5, and x=0. From the resulting data, it is readily seen that the ON voltage of the diode can be controlled between 0.15 V and 0.8 V. Also, it can be seen that a trade-off exits between the On voltage and the leakage current.

Next, the method for forming the diode bridge and the RTD on the same substrate will be explained with reference to FIGS. 10(a)-10(d).

As mentioned, it is disadvantageous to arrange the diode bridge and the strobe pulse generator separately. However, we discovered that both the four element mixed crystal Schottky diode made of InGaAlAs and the asymmetrical doped RTD can be latticematched with an InP substrate. Based on this, the diode bridge and the RTD are formed on the same substrate, in the invention.

The series of method steps involved will be referred to hereinbelow as "Process A-D" in connection with the corresponding FIGS. 10(a)-10(d), for sake of clarity in description.

Figure 10A:
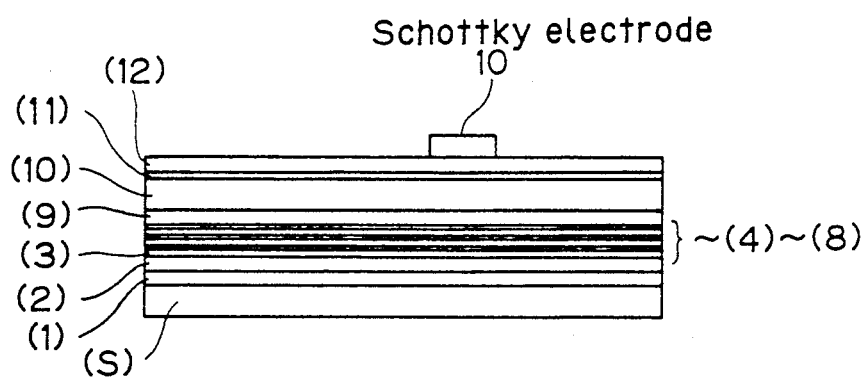
FIGS. 10(a)-10(d) are schematic diagrams depicting a process for manufacturing the RTD and SBD on the same substrate.

PROCESS A (FIG. 10(a))

On an InP substrate S having a thickness of about 400 microns, an undoped InAlAs layer 1 having a thickness of about 5000 Angstroms, is formed.

Next, an n+InGaAs layer 2 which has an impurity concentration of $1 \times 10^{19} cm^{-3}$ and which has a thickness of 4000 Angstroms, is formed on layer 1.

Next, an n+InGaAs layer 3 which has an impurity concentration of $1 \times 10^{18} cm^{-3}$ and which has a thickness of 1000 Angstroms, is formed on layer 2.

Next, an undoped InGaAs layer 4 having a thickness of less than 15 Angstroms, is formed. Then, an undoped AlAs layer 5 having a thickness of 30 Angstroms, an undoped InGaAs layer 6 having a thickness of 41 Angstroms, an undoped AlAs layer 7 having a thickness of less than 30 Angstroms and an undoped InGaAs layer 8 having a thickness of less than 15 Angstroms, are formed.

Next, an n+InGaAs layer 9 which has an impurity concentration of $1 \times 10^{17} cm^{-3}$ and which has a thickness of 1500 Angstroms, and an n-InGaAs layer 10 which has an impurity concentration of $1 \times 10^{14} cm^{-3}$ and which has a thickness of 4000 Angstroms, are formed.

Next, a layer 11 of $n+(InGaAs)_{0.5}(InAlAs)_{0.5}$ which has an impurity concentration of $1 \times 10^{19} cm^{-3}$ and which has a thickness of 500 Angstroms, is formed on layer 10.

Next, a layer 12 of $n-(InGaAs)_{0.5}(InAlAs)_{0.5}$ which has an impurity concentration of $1 \times 10^{16} cm^{-3}$ and which has a thickness of 3000 Angstroms, is formed on layer 11.

These layers are formed by use of such a device as a molecular beam epitaxial device (called MBE).

Then, a Schottky electrode 10 is formed by making electrode pattern films in such order as $Pt/W/WSi_2/Au$ on layer 12.

Figure 10B:
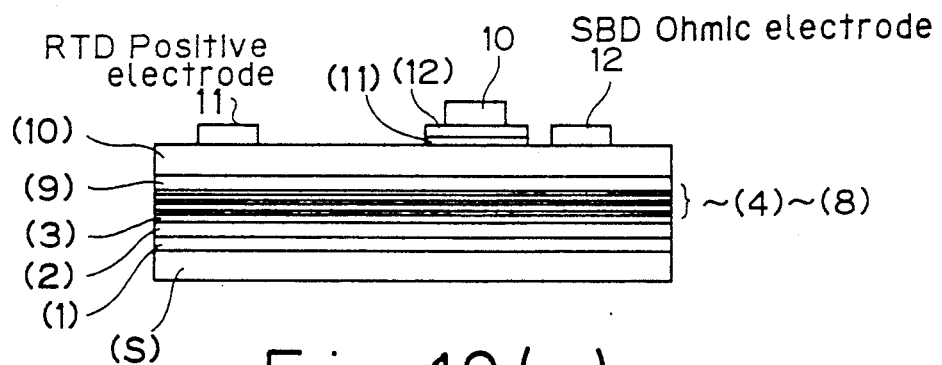

PROCESS B (FIG. 10(b))

After protecting the surface of electrode 10, with a resist film, layers 12 and 11 are removed by etching with an etching solution, such,as citric acid plus $H_2O_2$, so as to expose the surface of InGaAs layer 10 where the positive pole of the RTD is formed.

Next, on the surface of the InGaAs layer 10, a film is formed in such order as $WSi_2/Au$ by use of the lift-off method, and patterning is applied. As a result, RTD positive electrode 11 and ohmic electrode 12 of the Schottky barrier diode are formed.

Figure 10C:
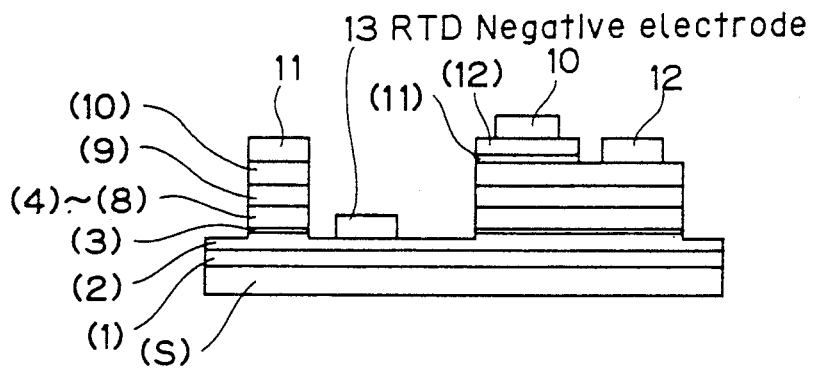

PROCESS C (FIG. 10(c))

After protecting the surface of the Schottky barrier diode electrode with a resist film and after masking the surface of RTD positive electrode, etching is applied by use of citric acid plus $H_2O_2$ solution.

As a result, InGaAs layer 2 is exposed, and a film layer is formed in such order as $WSi_2/Au$ on the surface of layer 2. Then, patterning is applied and RTD negative pole electrode 13 is formed.

Figure 10D:
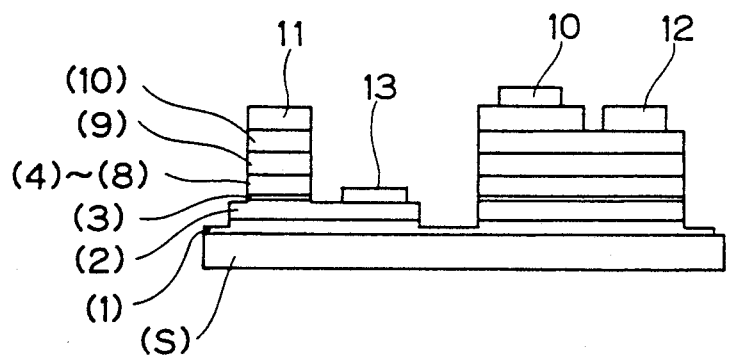

PROCESS D (FIG. 10(d))

The Schottky diode and the RTD portions are protected by a resist film. Then, etching is applied to InAlAs layer 1 which comprises a buffer layer, by use of citric acid plus $H_2O_2$ solution.

By use of the foregoing processing steps, a device comprising an RTD and an SBD are formed on the same substrate.

Figure 11:
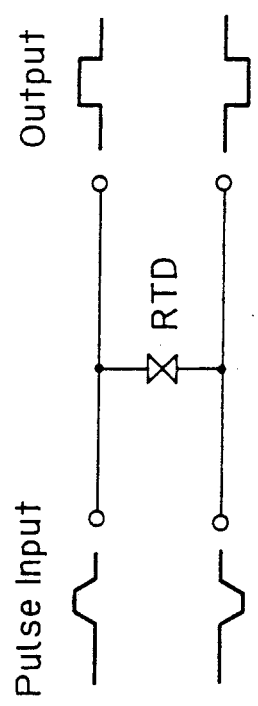
FIG. 11 is a circuit diagram depicting an exemplary RTD used as a pulse generator.

The RTD can be driven by such a pulse that it has sufficiently short time width in comparison with the time until avalanche breakdown occurs, for the following reasons. When the RTD is used as a pulse generator, such a circuit as shown in FIG. 11 is used. In this circuit, both a large amplitude and a large current density are required. The RTD operates, for example, at an ON-OFF duty ratio of 50% and at a frequency of several MHz. Under these conditions, coexistence of the large amplitude and the large current density is difficult, because the RTD would be destroyed by an avalanche breakdown which occurs in the depletion layer.

Therefore, if the conventional apparatus used an RTD in such a manner as a pulse generator, there would be the limitation of the necessity of requiring both large amplitude and large current density.

Figure 12A:
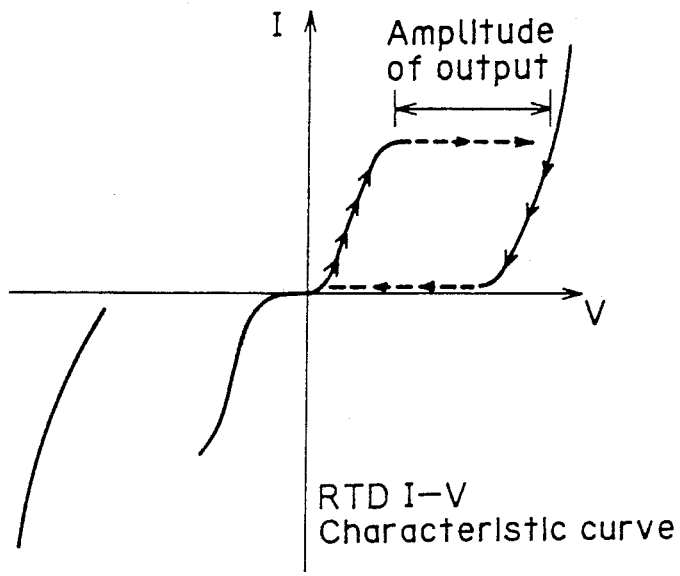
FIGS. 12(a)-12(c) are characteristic curves of the RTD for explaining the amplitudes thereof.
Figure 12B:
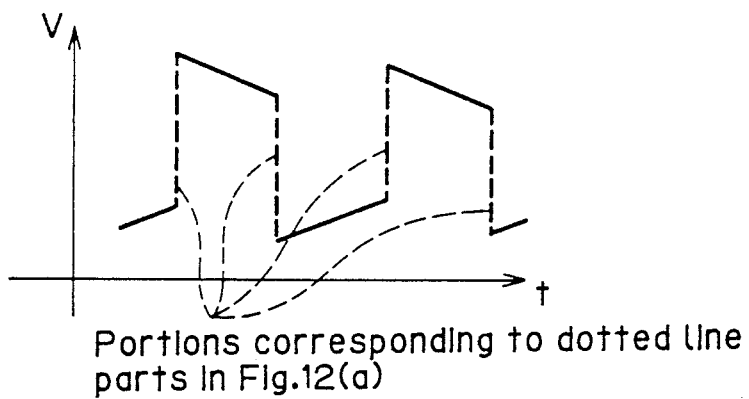
Figure 12C:
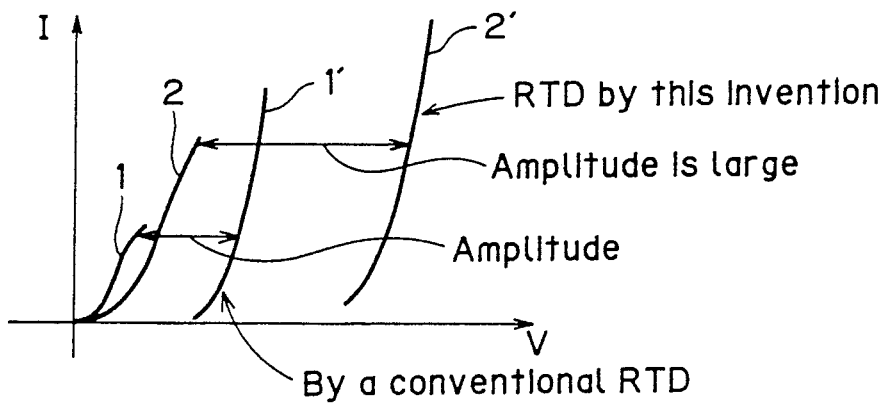

FIGS. 12(a)-12(c) depict the current-voltage characteristic curves to explain the amplitude of the RTD. When a pulse input is applied to the RTD, an I-V characteristic, such as shown by the arrows in FIG. 12(a), is obtained and the output voltage, such as shown in FIG. 12(b), is obtained. The output rises sharply at its edge portion, such as shown by the dotted lines in FIG. 12(b). Furthermore, as shown in FIG. 12(c), the output has a large amplitude (2 to 2') in comparison with the output of the conventional apparatus, which has an amplitude (1 to 1').

The characteristic of the RTD shown by 2—2' in FIG. 12(c) is changed by controlling the impurity concentration of the semiconductor on both sides of the resonance barrier part.

Destruction of the RTD can be avoided if the RTD is driven with a pulse having a short time width in comparison to the time until the avalanche breakdown occurs. In such a manner, the large amplitude and large current density can be concurrently attained. That is to say, if the RTD is driven by a pulse with a short time width, large output amplitude and large current density can be employed without destruction of the RTD.

In the invention, both the large amplitude and the large current density are attained by using a drive pulse for the RTD which has a frequency of about 10 MHz (=100 ns) and having a pulse width of about 5 ns (i.e. with an ON-Off duty cycle of about 5%)

As explained in FIGS. 6(a) and 6(b), in the invention, the impurity concentration of the n type InGaAs layer 9 formed on the positive pole side of the RTD is reduced by about $(1-2) \times 10^{17} cm^{-3}$, and is made to be asymmetrical with respect to the impurity concentration of the n type InGaAs layer 3 which functions as the negative pole.

Figure 13:
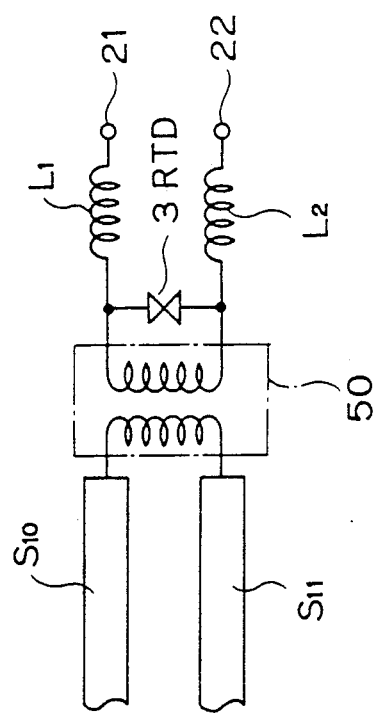
FIG. 13 is a diagram depicting a circuit wherein a transformer is provided behind the RTD in the sampling head shown in FIG. 3.

Additionally, the amplitude can be made larger by such a configuration as shown in FIG. 13, in which a transformer 50 is provided in the latter portion of the RTD. Transformer 50 can be minutely formed by using such semiconductor technology as explained in the above cross wiring.

As mentioned, in this invention, diode bridge 30 and the RTD which operates as a strobe pulse generator are formed on the same substrate, in a monolithic manner. Furthermore, the conductive state or non-conductive state of the diode bridge 30 is controlled by the strobe pulse from the RTD.

In the invention, the RTD can output a high frequency strobe pulse and hence a large and high speed power transformer used in the conventional apparatus for driving the Schottky barrier device, is not necessary. As a result, in the invention, the total size of the sampling head can be reduced.

Moreover, since a large and high speed power transformer is not used in this invention, the amount of noise which enters through the transformer into a signal transmission line, can be reduced.

In the invention, the impurity concentration of the layer on the positive pole side of the RTD is lowered, and is made asymmetrical with respect to the impurity concentration of the layer on the opposite side of the RTD. As a result, the depletion layer is expanded and the amplitude is increased. Furthermore, parasitic capacitance can be reduced. Thus, by use of the invention, both increase in speed and large amplitude are attained, at the same time.

When diode bridge 30 is driven by the strobe pulse, the maximum voltage ($V_M$) of the input signal which can pass through diode bridge 30 is given by the following equation:

$$V_M = V_S - V_{FS}$$

wherein $V_S$ is the amplitude voltage of the strobe pulse, and $V_{FS}$ is the total ON voltage of a pair of Schottky diodes connected in series in diode bridge 30.

In the invention, since the amplitude $V_S$ pf the strobe pulse is large, a large amplitude input signal can pass through diode bridge 30. Thus, a sampling head having a wide dynamic range is obtained.

Furthermore, in the invention, the four element mixed crystal of InGaAlAs is used for the diode bridge, and the ON voltage ($V_F$) of the diode can be controlled by changing the mixture ratio of the four element mixed crystal. As a result, it is possible to expand the dynamic range by lowering the On voltage $V_F$.

The foregoing description is illustrative of the principles of the invention. Numerous extensions and modifications thereof would be apparent to the worker skilled in the art. All such extensions and modifications are to be considered to be within the spirit and scope of the invention.

What is claimed is:

1. A sampling device comprising
    a substrate;
    a diode bridge formed on said substrate and to which a sampling signal is applied; and
    a resonance tunnel barrier device formed on said substrate and for controlling the gate time of said diode bridge to pass said sampling signal.

2. The device of claim 1, wherein said resonance tunnel barrier device comprises a layer formed on a positive pole side thereof, and a layer formed on an opposite side thereof, said layer on said positive pole side having a lowered impurity concentration which is asymmetrical to the impurity concentration on the layer on the opposite side.

3. The device of claim 1, further comprising means for driving said resonance tunnel barrier device with a pulse having sufficiently short time width in comparison to the time when avalanche breakdown occurs.

4. A sampling device comprising
    an input device to which a sampling signal is applied;
    a bridge diode for gating said sampling signal;
    a first thin film connecting said input terminal to said bridge diode;
    a resonance tunnel barrier diode for controlling the gating time of said bridge diode; and
    a second thin film for connecting said resonance tunnel barrier device and said bridge diode so that impedance mismatch between said first and second thin films is substantially nonexistent.

5. A sampling device comprising
    an input terminal to which a sampling signal is applied;
    a diode bridge to which said sampling signal is applied; and
    a strobe pulse generator, comprising switching means, for controlling the gate time of said diode bridge; wherein
    said switching means comprises a resonance tunnel barrier diode; wherein said diode bridge and said resonance tunnel barrier diode are formed on a substrate in a monolithic manner; wherein said strobe pulse generator generates a strobe pulse which is applied through said resonance tunnel barrier diode to gate said diode bridge; and wherein said resonance tunnel barrier diode is structured so that impurity concentration of a layer formed on a positive pole side of said resonance tunnel barrier diode is lowered and is made to be asymmetrical with respect to the impurity concentration of a layer formed on an opposite side thereof.

6. The device of claim 5, wherein further comprising a coplanar wave guide connected between said input terminal and said diode bridge; a coplanar stripping line connected between said resonance tunnel barrier diode and said diode bride.

7. The device of claim 5, wherein said diode bridge comprises a plurality of Shottky diodes comprising four element mixed crystal of InGaAlAs, and formed on a substrate of InP together with said resonance tunnel barrier diode.

* * * * *